US012570872B2

(12) United States Patent
Yoshida et al.

(10) Patent No.: US 12,570,872 B2
(45) Date of Patent: Mar. 10, 2026

(54) ACRYLIC POLYMERIZED POLYSILOXANE, COMPOSITION COMPRISING THE SAME, AND CURED FILM PRODUCED USING THE SAME

(71) Applicant: Merck Patent GmbH, Darmstadt (DE)

(72) Inventors: Naofumi Yoshida, Yokohama (JP); Toshiaki Nonaka, Tokyo (JP); Katsuto Taniguchi, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 965 days.

(21) Appl. No.: 17/298,548

(22) PCT Filed: Nov. 27, 2019

(86) PCT No.: PCT/EP2019/082657

§ 371 (c)(1),
(2) Date: May 29, 2021

(87) PCT Pub. No.: WO2020/109347

PCT Pub. Date: Jun. 4, 2020

(65) Prior Publication Data

US 2022/0025127 A1 Jan. 27, 2022

(30) Foreign Application Priority Data

Nov. 29, 2018 (JP) ................................ 2018-223644

(51) Int. Cl.

| | |
|---|---|
| ***C09D 183/10*** | (2006.01) |
| ***C08F 230/08*** | (2006.01) |
| ***C08G 77/442*** | (2006.01) |
| ***C08J 5/18*** | (2006.01) |
| ***C08K 5/23*** | (2006.01) |
| ***C08K 5/29*** | (2006.01) |
| ***G03F 7/022*** | (2006.01) |
| ***G03F 7/075*** | (2006.01) |

(52) U.S. Cl.

CPC .......... *C09D 183/10* (2013.01); *C08F 230/08* (2013.01); *C08G 77/442* (2013.01); *C08J 5/18* (2013.01); *C08K 5/23* (2013.01); *C08K 5/29* (2013.01); *G03F 7/022* (2013.01); *G03F 7/0757* (2013.01)

(58) Field of Classification Search

CPC ... C08G 77/442; C08L 230/08; C09D 183/10; C09D 151/085; C08F 230/08

See application file for complete search history.

(56) References Cited

U.S. PATENT DOCUMENTS

| | | | | |
|---|---|---|---|---|
| 2004/0137362 A1 | 7/2004 | De et al. | | |
| 2006/0088787 A1* | 4/2006 | Gonsalves | ............ | G03F 7/0758 528/36 |
| 2011/0129781 A1* | 6/2011 | Kim | ...................... | G03F 7/0045 430/323 |
| 2016/0200842 A1* | 7/2016 | Furuta | ................. | C08F 230/085 526/279 |
| 2019/0041751 A1* | 2/2019 | Cui | ......................... | G03F 7/094 |
| 2019/0204737 A1* | 7/2019 | Kim | ...................... | G03F 7/0757 |

FOREIGN PATENT DOCUMENTS

| | | | | |
|---|---|---|---|---|
| EP | 2540786 A1 | 1/2013 | | |
| JP | 2003-238887 A | 8/2003 | | |
| JP | 2006-504827 A | 2/2006 | | |
| JP | 2006045316 A * | 2/2006 | ................ | C08F 2/44 |
| JP | 2012-037595 A | 2/2012 | | |
| JP | 2012-068417 A | 4/2012 | | |
| JP | 2012-532981 A | 12/2012 | | |
| JP | 2014-129550 A | 7/2014 | | |
| JP | 2015-127829 A | 7/2015 | | |
| KR | 10-2011-0013202 A | 2/2011 | | |
| WO | 2011/105101 A1 | 9/2011 | | |

OTHER PUBLICATIONS

Machine translation of JP 2006-045316 (no date).*
Machine translation of JP 2012-68417 (no date).*
International Preliminary Report on Patentability received for PCT Patent Application No. PCT/EP2019/082657, mailed on Jun. 10, 2021, 7 pages.
International Search Report and Written Opinion received for PCT Patent Application No. PCT/EP2019/082657, mailed on Jan. 29, 2020, 8 pages.

* cited by examiner

*Primary Examiner* — Marc S Zimmer
(74) *Attorney, Agent, or Firm* — Faegre Drinker Biddle & Reath LLP

(57) ABSTRACT

[Problem] To provide a novel polysiloxane compound capable of forming a cured film that is capable of improving adhesion between a substrate and the cured film when the cured film is formed. [Means for Solution] To provide an acrylic polymerized polysiloxane in which a specific structure in the molecule is bonded via an acrylic polymerization unit, and a composition comprising the same.

7 Claims, No Drawings

ACRYLIC POLYMERIZED POLYSILOXANE, COMPOSITION COMPRISING THE SAME, AND CURED FILM PRODUCED USING THE SAME

CROSS-REFERENCE TO RELATED APPLICATIONS

This application is a national stage application (under 35 U.S.C. § 371) of PCT/EP2019/082657, filed Nov. 27, 2019, which claims benefit of Japanese Application No. 2018-223644, filed Nov. 29, 2018, both of which are incorporated herein by reference in their entirety.

BACKGROUND OF THE INVENTION

Technical Field

The present invention relates to an acrylic polymerized polysiloxane and a composition comprising the acrylic polymerized polysiloxane. The present invention also relates to a cured film produced using the composition comprising the acrylic polymerized polysiloxane and a device comprising the same.

Background Art

In recent years, various proposals have been made for further improving light utilization efficiency and energy saving in optical devices such as displays, light emitting diodes, and solar cells. For example, in a liquid crystal display, a method for increasing the aperture ratio of a display device by forming a transparent planarization film on a TFT device and forming pixel electrodes on the planarization film is known.

As the material for such a planarization film for a TFT substrate, a material combining an acrylic resin with a quinonediazide compound is known. Since these materials have planarizing properties and photosensitivity, contact holes and other patterns can be formed. However, as resolution and frame frequency are increased, planarization becomes severe due to more complicated wiring, so that it becomes difficult for these materials to cope with this problem.

Polysiloxane is known as a material for forming a cured film having high heat resistance, high transparency and high resolution. In particular, silsesquioxane derivatives have been widely used because they are excellent in low dielectric constant, high transmittance, high heat resistance, UV resistance, and coating uniformity. Silsesquioxane is a polymer composed of a trifunctional siloxane structural unit RSi $(O_{1.5})$ and is an intermediate existence between inorganic silica ($SiO_2$) and organic silicone ($R_2SiO$) in terms of chemical structure. While it is soluble in organic solvent, the cured product obtained from it is a specific compound having a characteristic high heat resistance, which is close to that of inorganic silica.

When a cured film is formed using a composition comprising polysiloxane, it is required to improve adhesion between the cured film and a substrate. For example, a photosensitive composition comprising polymer produced by copolymerization of a monomer comprising polyfunctional siloxane (Patent Document 1) and a composition comprising an acrylic-based copolymer that contains a hydrolyzable silyl group (Patent Document 2) have been proposed.

PRIOR ART DOCUMENTS

Patent Documents

[Patent Document 1] JP-A 2012-37595
[Patent Document 2] JP-A 2014-129550

SUMMARY OF THE INVENTION

Problems to be Solved by the Invention

The present invention provides a novel polysiloxane compound capable of forming a cured film that is capable of improving adhesion between a substrate and the cured film when the cured film is formed. The formed cured film is excellent in heat resistance and transparency.

Means for Solving the Problems

The acrylic polymerized polysiloxane according to the present invention comprises a repeating unit represented by the formula (Ia):

(Ia)

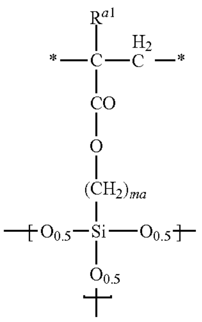

(wherein,
$R^{a1}$ is hydrogen or methyl, and
ma is each independently an integer of 1 to 6), and an acrylic polymerization unit represented by the formula (a):

(a)

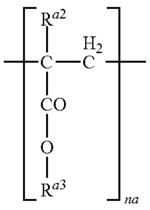

(wherein,
$R^{a2}$ is independently hydrogen or methyl,
$R^{a3}$ is hydrogen or a mono- to hexa-valent $C_{1-50}$ hydrocarbon group, where one or more methylene in the hydrocarbon group may be replaced with oxy, amino, imino and/or carbonyl, and when $R^{a3}$ is multivalent, $R^{a3}$ connects carbonyloxy in the formula (a) and carbonyloxy contained in other repeating unit represented by the formula (a), and
na is an integer of 0 or more),
wherein the site marked with * in at least one repeating unit in the formula (Ia) is connected directly or via an acrylic polymerization unit represented by the formula (a) to the site marked with * in other repeating unit represented by the formula (Ia).

Further, the acrylic polymerized polysiloxane according to the present invention is obtained by the following steps:

(1) hydrolyzing and polymerizing a silane monomer represented by the formula (ia) or mixture thereof to obtain an acrylic group-containing polysiloxane:

(ia)

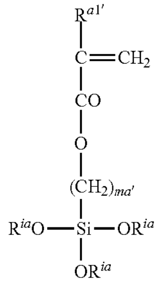

(wherein, $R^{a1'}$ is hydrogen or methyl, ma' is an integer of 1 to 6, and $R^{ia}$ is a linear or branched $C_{1-6}$-alkyl), and (2) cleaving the carbon-carbon double bond in the resulting acrylic group-containing polysiloxane and polymerizing it.

Further, the polysiloxane composition according to the present invention comprises the above polysiloxane and a solvent.

Further, the method for producing a cured film according to the present invention comprises applying the above composition on a substrate and heating.

The electronic device according to the present invention comprises the above-described cured film.

Effects of the Invention

The acrylic polymerized polysiloxane according to the present invention can form a cured film having high heat resistance and excellent in transparency. Moreover, it is excellent in adhesion between the obtained cured film and a substrate. The composition comprising the acrylic polymerized polysiloxane according to the present invention can form a positive or negative pattern by imparting photosensitivity to it.

DETAILED DESCRIPTION OF THE INVENTION

Mode for Carrying Out the Invention

Embodiments of the present invention are described below in detail. Hereinafter, symbols, units, abbreviations, and terms have the following meanings in the present specification unless otherwise specified.

In the present specification, unless otherwise specifically mentioned, the singular includes the plural and "one" or "that" means "at least one". In the present specification, unless otherwise specifically mentioned, an element of a concept can be expressed by a plurality of species, and when the amount (for example, mass % or mol %) is described, it means sum of the plurality of species.

"And/or" includes a combination of all elements and also includes single use of the element.

In the present specification, when a numerical range is indicated using "to" or "-", unless otherwise specifically mentioned, it includes both endpoints and units thereof are common. For example, 5 to 25 mol % means 5 mol % or more and 25 mol % or less.

In the present specification, the hydrocarbon means one including carbon and hydrogen, and optionally including oxygen or nitrogen. The hydrocarbyl group means a monovalent or divalent or higher valent hydrocarbon. In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon. These aliphatic hydrocarbon groups and aromatic hydrocarbon groups optionally contain fluorine, oxy, hydroxy, amino, carbonyl, silyl, or the like. Further, the aromatic ring means a hydrocarbon comprising a conjugated unsaturated ring structure, and the alicycle means a hydrocarbon comprising a ring structure but no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and optionally includes a linear or branched alkyl in the cyclic structure as a side chain.

In the present specification, the aryl means a group obtained by removing any one hydrogen from an aromatic hydrocarbon. The alkylene means a group obtained by removing any two hydrogens from a linear or branched, saturated hydrocarbon. The arylene means a hydrocarbon group obtained by removing any two hydrogens from an aromatic hydrocarbon.

In the present specification, the description such as "$C_{x-y}$", "$C_x$-$C_y$" and "$C_x$" means the number of carbons in the molecule or substituent group. For example, $C_{1-6}$ alkyl means alkyl having 1 to 6 carbons (such as methyl, ethyl, propyl, butyl, pentyl and hexyl). Further, the fluoroalkyl as used in the present specification refers to one in which one or more hydrogens in alkyl is replaced with fluorine, and the fluoroaryl is one in which one or more hydrogens in aryl are replaced with fluorine.

In the present specification, when polymer has a plural types of repeating units, these repeating units copolymerize. Unless otherwise specifically mentioned, these copolymerization may be any of alternating copolymerization, random copolymerization, block copolymerization, graft copolymerization, or a mixture thereof. When polymer or resin is represented by a structural formula, n, m or the like attached next to parentheses indicate the number of repetitions.

In the present specification, "%" represents mass % and "ratio" represents ratio by mass.

In the present specification, Celsius is used as the temperature unit. For example, 20 degrees means 20 degrees Celsius.

In the present specification, the polysiloxane means a polymer including a bond of Si—O—Si (siloxane bond) as a main chain. Further, in the present specification, silsesquioxane polymer represented by the formula $(RSiO_{1.5})_n$ shall also be included as the general polysiloxane. Further, in the present specification, the polysiloxane shall also include the acrylic polymerized polysiloxane.

In this specification, "acrylic" shall also include "methacrylic".

<Acrylic Polymerized Polysiloxane>

The acrylic polymerized polysiloxane according to the present invention comprises a repeating unit represented by the formula (Ia):

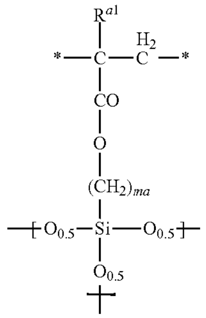

(Ia)

(wherein,
$R^{a1}$ is hydrogen or methyl, and
ma is each independently an integer of 1 to 6, preferably an integer of 1 to 3, and most preferably 3), and an acrylic polymerization unit represented by the formula (a):

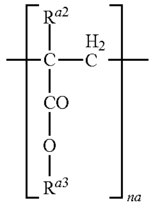

(a)

(wherein,
$R^{a2}$ is independently hydrogen or methyl,
$R^{a3}$ is hydrogen or a mono- to hexa-valent $C_{1-50}$ hydrocarbon group, where one or more methylene in the hydrocarbon group may be replaced with oxy, amino, imino and/or carbonyl, and when $R^{a3}$ is multivalent, $R^{a3}$ connects carbonyloxy in the formula (a) and carbonyloxy contained in other repeating unit represented by the formula (a), and
na is an integer of 0 or more),
wherein the site marked with * in at least one repeating unit in the formula (Ia) is connected directly or via an acrylic polymerization unit represented by said formula (a) to the site marked with * in other repeating unit represented by the formula (Ia).

In the acrylic polymerization unit represented by the formula (a), the formula (a) may be bonded to other formula (a) to form a block, but if there are many acrylic polymerization units, heat resistance tends to decrease. Therefore, in one molecule of the acrylic polymerized polysiloxane, (the sum of na)/(the number of repeating units represented by (Ia)+the sum of na) is preferably 0.15 or less, and more preferably 0.05 or less.

Although na is not particularly limited as long as it satisfies the above, it is preferably 0 to 6, more preferably 0 to 4, and further preferably 1 to 2. When a plurality of (a) are included, each na may be the same or different.

Since heat resistance tends to decrease when the number of carbon atoms is large, $R^{a3}$ preferably has 1 to 30 carbon atoms, and more preferably 1 to 20 carbon atoms.

Although the acrylic polymerization unit represented by the formula (a) is not essential, it is preferably comprised for improving adhesion.

Examples of $R^{a3}$ include the followings:

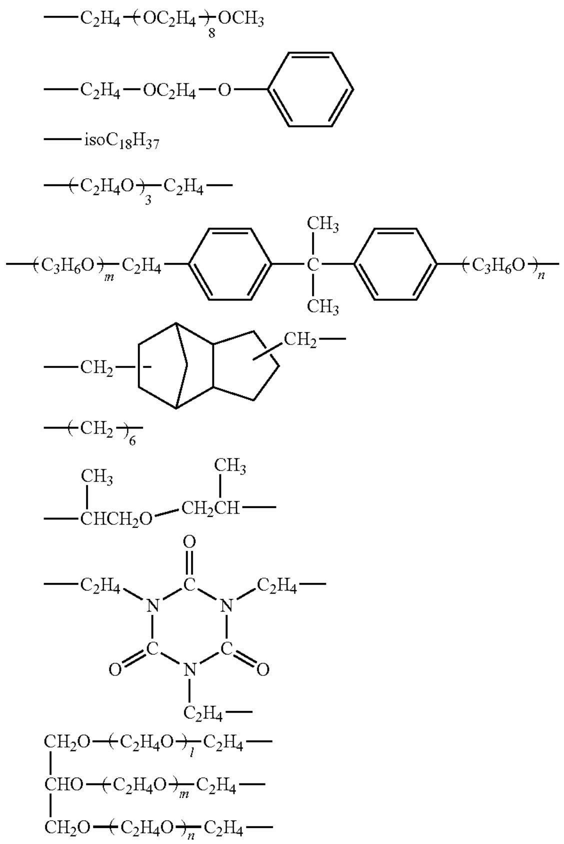

l + m + n = 6

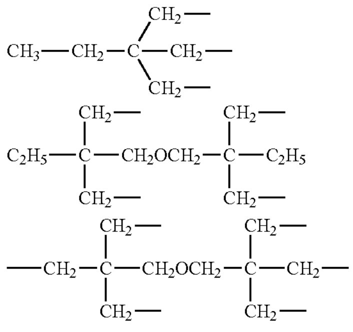

Among the above, tris-(2-acryloxyethyl) isocyanurate and dipentaerythritol hexaacrylate are preferable.

In addition, when the repeating unit represented by the formula (a) is a group derived from an acrylic compound containing a plurality of double bonds, it is not necessary that all the double bonds are cleaved. This means, the acrylic polymerized polysiloxane may contain some double bonds that are not cleaved. However, from the viewpoint of stability of the compound, and the like, it is preferable that the ratio of double bonds that are not cleaved is small.

In the polymerization units represented by the formula (a), $R^{a3}$ may be a group obtained by removing a plurality of, preferably two or three hydrogens from a nitrogen and/or oxygen-containing cycloaliphatic hydrocarbon compound that contains a hydrocarbon group substituted with an amino group, an imino group, and/or a carbonyl group (preferably a group obtained by removing two or three hydrogens from a nitrogen-containing aliphatic hydrocarbon ring that contains an imino group and/or a carbonyl group, more preferably a group obtained by removing two or three hydrogens from a five-membered or six-membered ring that contains nitrogen as a member, and most preferably a group obtained by removing two or three hydrogens from a piperidine derivative, pyrrolidine derivative, or isocyanurate derivative).

The blending ratio of the repeating unit represented by the formula (Ia) is preferably 10 to 100 mol % to the total number of the repeating units in the acrylic polymerized polysiloxane because heat resistance is decreased when the blending ratio is high.

In the present specification, "the total number of the repeating units in the acrylic polymerized polysiloxane" means the total number of the siloxane repeating units in the acrylic polymerized polysiloxane. For example, the acrylic polymerization unit represented by the formula (a) shall not be included in this total number.

The acrylic polymerized polysiloxane according to the present invention preferably further comprises a repeating unit represented by the formula (Ib):

(Ib)

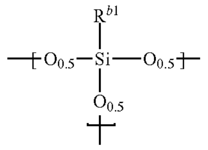

(wherein, $R^{b1}$ represents hydrogen, a linear, branched or cyclic, saturated or unsaturated $C_{1-30}$ aliphatic hydrocarbon group, or an aromatic hydrocarbon group, where the aliphatic hydrocarbon group and aromatic hydrocarbon group are each unsubstituted or substituted with fluorine, hydroxy or alkoxy, and in the aliphatic hydrocarbon group and aromatic hydrocarbon group, methylene is not replaced, or one or more methylene are replaced with oxy, amino, imino or carbonyl, provided that $R^{b1}$ is not hydroxy or alkoxy).

In addition, here, the above-described methylene includes a terminal methyl as well.

Further, the above-described "substituted with fluorine, hydroxy or alkoxy" means that a hydrogen atom directly connected to a carbon atom in an aliphatic hydrocarbon group and an aromatic hydrocarbon group is replaced with fluorine, hydroxy or alkoxy. In the present specification, the same applies to other similar descriptions.

In the repeating unit represented by the formula (Ib), $R^{b1}$ includes, for example, (i) alkyl, such as methyl, ethyl, propyl, butyl, pentyl, hexyl, heptyl, octyl and decyl, (ii) aryl, such as phenyl, tolyl and benzyl, (iii) fluoroalkyl, such as trifluoromethyl, 2,2,2-trifluoroethyl and 3,3,3-trifluoropropyl, (iv) fluoroaryl, (v) cycloalkyl, such as cyclohexyl, (vi) nitrogen-containing groups having amino or imide structure, such as isocyanate and amino, and (vii) oxygen-containing groups having an epoxy structure such as glycidyl, or an acryloyl structure or a methacryloyl structure. It is preferably methyl, ethyl, propyl, butyl, pentyl, hexyl, phenyl, tolyl, glycidyl and isocyanate. As fluoroalkyl, perfluoroalkyl is preferred, and trifluoromethyl and pentafluoroethyl are particularly preferred. The compound wherein $R^{b1}$ is methyl is preferred, since raw material thereof is easily obtained, it has high film hardness after curing and high chemical resistance. Further, the compound wherein $R^{b1}$ is phenyl is preferred, since it increases solubility of said polysiloxane in the solvent and the cured film becomes hard to crack. It is preferred that $R^{b1}$ has hydroxy, glycidyl, isocyanate or amino, since the adhesion to the substrate is increased.

Examples of the acrylic polymerized polysiloxane according to the present invention include those comprising the following structures.

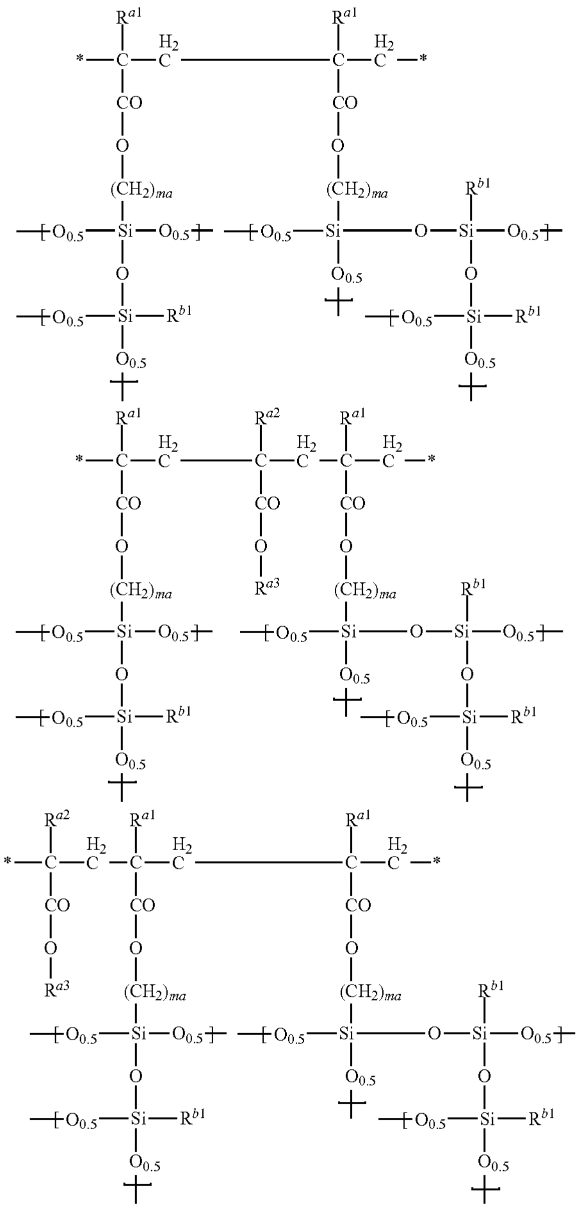

The blending ratio of the repeating unit represented by the formula (Ib) is preferably 0 to 90 mol % to the total number of the repeating units in the acrylic polymerized polysiloxane, because when the blending ratio is high, strength and heat resistance of the cured film to be formed is increased, but adhesion is decreased.

The acrylic polymerized polysiloxane according to the present invention preferably further comprises a repeating unit represented by the following formula (Ic):

(Ic)

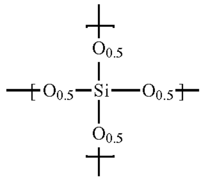

and/or a repeating unit represented by the following formula (Id):

(Id)

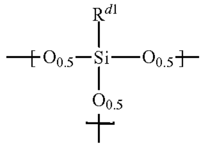

(wherein, $R^{d1}$ is a group obtained by removing a plurality of hydrogens from a nitrogen and/or oxygen-containing cyclic aliphatic hydrocarbon compound that contains an amino group, an imino group, and/or a carbonyl group).

$R^{d1}$ in the formula (Id) is preferably a group obtained by removing a plurality of, preferably two or three hydrogens from a nitrogen-containing aliphatic hydrocarbon ring that contains an imino group, and/or a carbonyl group, more preferably a five-membered or six-membered ring that contains nitrogen as a member. For example, it is a group obtained by removing two or three hydrogens from piperidine, pyrrolidine, and isocyanurate. The group which is not bonded to oxygen in the formula (Id) connects Si contained in a plurality of repeating units.

When the blending ratio of the repeating units represented by the formulas (Id) and (Ic) is high, photosensitivity of the composition is decreased, compatibility with solvents or additives is decreased, and film stress is increased, so that cracks become easy to occur. Therefore, the blending ratio is preferably 40 mol % or less, and more preferably 20 mol % or less, to the total number of the repeating units of acrylic polymerized polysiloxane.

The acrylic polymerized polysiloxane according to the present invention may further comprise a repeating unit represented by the following formula (Ie):

(Ie)

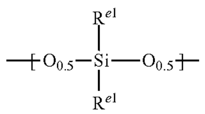

(wherein, $R^{e1}$ is each independently represents hydrogen, a linear, branched or cyclic, saturated or unsaturated $C_{1-30}$ aliphatic hydrocarbon group, or an aromatic hydrocarbon group, where the aliphatic hydrocarbon group and aromatic hydrocarbon group are unsubstituted or substituted with fluorine, hydroxy or alkoxy, and in the aliphatic hydrocarbon group and aromatic hydrocarbon group, methylene is not replaced or replaced with oxy, amino, imino or carbonyl, provided that $R^{e1}$ is not hydroxy or alkoxy).

In addition, here, the above-described methylene includes a terminal methyl as well.

In the repeating unit represented by the formula (Ie), $R^{e1}$ includes, for example, (i) alkyl, such as methyl, ethyl, propyl, butyl, pentyl, hexyl, heptyl, octyl and decyl, (ii) aryl, such as phenyl, tolyl and benzyl, (iii) fluoroalkyl, such as trifluoromethyl, 2,2,2-trifluoroethyl and 3,3,3-trifluoropropyl, (iv) fluoroaryl, (v) cycloalkyl, such as cyclohexyl, (vi) nitrogen-containing groups having amino or imide structure, such as isocyanate and amino, and (vii) oxygen-containing groups having an epoxy structure such as glycidyl, or an acryloyl structure or a methacryloyl structure. It is preferably methyl, ethyl, propyl, butyl, pentyl, hexyl, phenyl, tolyl, glycidyl and isocyanate. As fluoroalkyl, perfluoroalkyl is preferred, and trifluoromethyl and pentafluoroethyl are particularly preferred. The compound wherein $R^{e1}$ is methyl is preferred, since raw material thereof is easily obtained, it has high film hardness after curing and high chemical resistance. Further, the compound wherein $R^{e1}$ is phenyl is preferred, since it increases solubility of said polysiloxane in the solvent and the cured film becomes hard to crack. It is preferred that $R^{e1}$ has hydroxy, glycidyl, isocyanate or amino, since the adhesion to the substrate is increased.

By having the repeating unit of the above formula (Ie), the acrylic polymerized polysiloxane according to the present invention can partially have a linear structure. However, since heat resistance is decreased, it is preferable that there are few linear structure parts. Specifically, the repeating unit of the formula (Ie) is preferably 30 mol % or less to the total number of the repeating units in the acrylic polymerized polysiloxane.

The acrylic polymerized polysiloxane according to the present invention has a structure in which the above-described repeating units or blocks are bonded, but preferably has a silanol at its terminal. Such a silanol group is one in which $-O_{0.5}H$ is bonded to the bonding hand of the above-described repeating units or blocks.

The mass average molecular weight of the acrylic polymerized polysiloxane according to the present invention is not particularly limited. However, a higher molecular weight tends to improve coatability. On the other hand, the lower the molecular weight is, the less the synthesis conditions are limited and the easier the synthesis is. Polysiloxane having a very high molecular weight is difficult to synthesize. For this reason, polysiloxane usually has the mass average molecular weight of 1,500 to 20,000, and preferably 2,000 to 15,000 from the viewpoint of solubility in organic solvents and solubility in alkaline developers. Here, the mass average molecular weight means a mass average molecular weight in terms of polystyrene, and it can be measured by the gel permeation chromatography using polystyrene as a reference.

Further, when the acrylic polymerized polysiloxane according to the present invention is contained in a composition having photosensitivity, a cured film is formed on a substrate through coating, imagewise exposure and development. At this time, it is necessary that a difference in solubility occurs between the exposed area and the unexposed area. In the case of a positive composition, the coating film in the exposed area (in the case of a negative composition, the coating film in the unexposed area) should have above certain solubility to a developer. For example, it is considered that a pattern can be formed by exposure-development if dissolution rate of a pre-baked coating film to a 2.38% tetramethylammonium hydroxide (hereinafter sometimes referred to as TMAH) aqueous solution (hereinafter sometimes referred to as alkali dissolution rate or ADR, which is described later in detail) is 50 Å/sec or more. However, since the required solubility varies depending on the thickness of the cured film to be formed and the development conditions, polysiloxane should be appropriately selected according to the development conditions. For example, if the film thickness is 0.1 to 100 μm (1,000 to 1,000,000 Å), in the case of positive composition, the dissolution rate to the 2.38% TMAH aqueous solution is preferably 50 to 5,000 Å/sec, and more preferably 200 to 3,000 Å/sec, although it varies depending on the type and amount of the photosensitizer and silanol condensation catalyst, which are contained in the composition. In the case of the negative type, the dissolution rate to the 2.38% TMAH aqueous solution is preferably 50 to 20,000 Å/sec, and more preferably 1,000 to 10,000 Å/sec.

As for the acrylic polymerized polysiloxane according to the present invention, a polysiloxane having any ADR within the above range may be selected depending on the application and required characteristics. By combining the acrylic polymerized polysiloxane according to the present invention with polysiloxane comprising any of (Ib) to (Ie) and not comprising (Ia) a mixture having a desired ADR can be prepared.

Polysiloxane having different alkali dissolution rates and mass average molecular weights can be prepared by changing the catalyst, reaction temperature, reaction time or polymer. Using a combination of polysiloxane having different alkali dissolution rates, it is possible to improve reduction of residual insoluble matter after development, reduction of pattern reflow, pattern stability, and the like.

Such polysiloxane includes, for example, (M) polysiloxane whose film after pre-baked is soluble to a 2.38 mass % TMAH aqueous solution and has dissolution rate of 200 to 3,000 Å/sec.

Further, a composition having a desired dissolution rate can be obtained by mixing, if necessary.

(L) polysiloxane whose film after pre-baked is soluble to a 5 mass % TMAH aqueous solution and has dissolution rate of 1,000 Å/sec or less, or H) polysiloxane whose film after pre-baked has dissolution rate to a 2.38 mass % TMAH aqueous solution of 4,000 Å/sec or more.

[Measurement of Alkaline Dissolution Rate (ADR) and Calculation Method Thereof]

Using a TMAH aqueous solution as an alkaline solution, the alkali dissolution rate of polysiloxane or a mixture thereof is measured and calculated as described below.

Polysiloxane is diluted with propylene glycol monomethyl ether acetate (hereinafter referred to as PGMEA) so as to be 35 mass % and dissolved while stirring at room temperature with a stirrer for 1 hour. In a clean room under an atmosphere of temperature of 23.0±0.5° C. and humidity of 50±5.0%, using a pipette, 1 cc of the prepared polysiloxane solution is dropped on the center area of a 4-inch silicon wafer having thickness of 525 μm, spin-coated so as to be a thickness of 2±0.1 μm, and then the resultant film is heated on a hot plate at 100° C. for 90 seconds to remove the solvent. The film thickness of the coating film is measured with a spectroscopic ellipsometer (manufactured by J. A. Woollam).

Next, the silicon wafer having this film is gently immersed in a glass petri dish having a diameter of 6 inches, into which 100 ml of a TMAH aqueous solution adjusted to 23.0±0.1° C. and having a predetermined concentration was put, then allowed to stand, and the time until the film disappeared is measured. The dissolution rate is determined by dividing by the time until the film in the area 10 mm inside from the wafer edge disappears. In the case that the dissolution rate is remarkably slow, the wafer is immersed in a TMAH aqueous solution for a certain period and then heated for 5 minutes on a hot plate at 200° C. to remove moisture taken in the film during the dissolution rate measurement. Thereafter, film thickness is measured, and the dissolution rate is calculated by dividing the variation amount of before and after the immersion by the immersion time. The above measurement method is performed 5 times, and the average of the obtained values is taken as the dissolution rate of polysiloxane.

<Synthetic Method of Acrylic Polymerized Polysiloxane According to the Present Invention>

The acrylic polymerized polysiloxane according to the present invention is obtained, for example, by the following steps:

(1) hydrolyzing and polymerizing a silane monomer represented by the formula (ia) or mixture thereof optionally in the presence of acidic catalyst or basic catalyst to obtain an acrylic group-containing polysiloxane:

(ia)

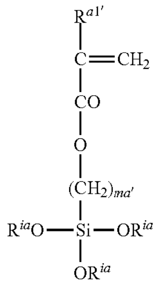

(wherein, $R^{a1'}$ is hydrogen or methyl, ma' is an integer of 1 to 6, preferably an integer of 1 to 3, and most preferably 3

$R^{ia}$ is a linear or branched $C_{1-6}$-alkyl), and (2) cleaving the carbon-carbon double bond in the resulting acrylic group-containing polysiloxane and polymerizing it.

Here, the above-described mixture may be a mixture of a silane monomer represented by the formula (ia) and other silane monomer represented by the formula (ia), a mixture with the silane monomer described by the formulae (ib) to (ie), and a mixture with a compound other than silane monomer.

The acrylic polymerized polysiloxane obtained by the above steps provides a composition that exhibits excellent characteristics, and the structure obtained includes, for example, those exemplified above. However, since various structures can be taken according to type of the monomer, blending ratio and the like, it is conceivable that structures other than those exemplified above can also be taken.

[Step (1)]

In the formula (ia), preferable $R^{ia}$ includes methyl, ethyl, n-propyl, isopropyl, n-butyl and the like. In the formula (ia), a plurality of $R^{ia}$ are contained, but each $R^{ia}$ may be the same or different.

The silane monomer represented by the formula (ib) is preferably further combined with the silane monomer represented by the formula (ia):

$$R^{b1'}—Si—(OR^{ib})_3 \quad (ib)$$

(wherein, $R^{b1'}$ represents hydrogen, a linear, branched or cyclic, saturated or unsaturated $C_{1-30}$ aliphatic hydrocarbon group, or an aromatic hydrocarbon group;

where the aliphatic hydrocarbon group and aromatic hydrocarbon group are unsubstituted or substituted with fluorine, hydroxy or alkoxy, and in the aliphatic hydrocarbon group and aromatic hydrocarbon group, methylene is not replaced or replaced by oxy, amino, imino or carbonyl, provided that $R^{b1'}$ is not hydroxy or alkoxy, and $R^{ib}$ is a linear or branched $C_{1-6}$-alkyl)

In the formula (ib), preferable $R^{b1'}$ is the same as the above-described preferable $R^{b1}$. Preferred $R^{ib}$ includes methyl, ethyl, n-propyl, isopropyl, n-butyl and the like.

Specific examples of the silane monomer represented by the formula (ib) include, for example, methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoromethyltriethoxysilane, and 3,3,3-trifluoropropyltrimethoxysilane. Among these, methyltrimethoxysilane, methyltriethoxysilane, methyltripropoxysilane, and phenyltrimethoxysilane are preferable. Two or more types of silane monomers represented by the formula (ib) can be combined.

The acrylic polymerized polysiloxane can also be obtained by further combining silane monomers represented by the following formulae (ic) and/or (id) with the silane monomers represented by the above formulae (ia) and/or (ib). When the silane monomers represented by the formulae (ic) and/or (id) are used in this way, polysiloxane containing the repeating units (Ic) and/or (Id) can be obtained.

$$Si(OR^{ic})_4 \quad (ic)$$

$$R^{d1'}—Si—(OR^{id})_3 \quad (id)$$

(wherein, $R^{ic}$ and $R^{id}$ are each independently a linear or branched $C_{1-6}$-alkyl, and examples thereof include methyl, ethyl, n-propyl, isopropyl, and n-butyl. A plurality of $R^{ic}$ and $R^{id}$ are contained in one monomer, and each $R^{ic}$ and $R^{id}$ can be the same or different, $R^{d1'}$ is a group obtained by removing a plurality of hydrogens from a nitrogen and/or oxygen-containing cyclic aliphatic hydrocarbon compound that contains an amino group, an imino group and/or a carbonyl group. Preferred $R^{d1'}$ is the same as the above-described preferable $R^{d1}$.

Specific examples of the silane monomer represented by the formula (ic) include tetramethoxysilane, tetraethoxysilane, tetraisopropoxy-silane, tetra-n-butoxysilane and the like.

Specific examples of the silane monomer represented by the formula (id) include tris-(3-trimethoxysilylpropyl)isocyanurate, tris-(3-triethoxysilylethyl)isocyanurate, tris-(3-triethoxysilylpropyl)isocyanurate, tris-(3-trimethoxysilylethyl)isocyanurate and the like.

Furthermore, a silane monomer represented by the following formula (ie) can be combined. When the silane monomer represented by the formula (ie) is used, polysiloxane containing the repeating unit (Ie) can be obtained.

$$(R^{e1'})_2—Si—(OR^{ie})_2 \quad (ie)$$

(wherein, $R^{ie}$ is each independently a linear or branched $C_{1-6}$-alkyl, and examples thereof include methyl, ethyl, n-propyl, isopropyl, and n-butyl. A plurality of $R^{ie}$ are contained in one monomer, and each $R^{ie}$ can be the same or different, $R^{e1'}$ each independently represents hydrogen, a linear, branched or cyclic, saturated or unsaturated $C_{1-30}$ aliphatic hydrocarbon group or an aromatic hydrocarbon group, where the aliphatic hydrocarbon group and aromatic hydrocarbon group are unsubstituted or substituted with fluorine, hydroxy or alkoxy, and in the aliphatic hydrocarbon group and aromatic hydrocarbon group, methylene is not replaced or replaced by oxy, amino, imino or carbonyl, provided that $R^{e1'}$ is not hydroxy or alkoxy. Preferable $R^{e1'}$ is the same as the above-described preferable $R^{e1}$.

Specific examples of the silane monomer represented by the formula (ie) include dimethyldiethoxysilane, diphenyldimethoxysilane and the like.

[Step (2)]

In the step (2), the carbon-carbon double bond of the acrylic group in the resulting acrylic group-containing polysiloxane is cleaved and polymerized. In this reaction, it is preferable to use, as a polymerization initiator, for example, an azo-based initiator such as 2,2'-azabisisobutyronitrile, 2,2'-azobis(2,4-dimethylvaleronitrile), 2,2'-azobis(2-methylbutyronitrile), 4,4'-azobis (4-cyanovaleric acid), 2,2'-azobis (2-methylpropionamidine) dihydrochloride, 2,2'-azobis [2-(2-imidazoline-2-yl)propane] dihydrochloride and 2,2'-azobis(2-methylpropionic acid) dimethyl; and a peroxide-based initiator such as dibenzoyl peroxide, tert-butyl hydroperoxide (70% aqueous solution), α, α-dimethylbenzyl hydroperoxide, tert-butyl peroxide and bis (1-methyl-1-phenylethyl) peroxide. Although the carbon-carbon double bond of the acrylic group is cleaved and polymerized, a part thereof may remain without being cleaved and polymerized.

The blending amount of the polymerization initiator is not particularly limited but is preferably 0.1 to 500 mol % to the number of the acrylic functional groups.

In the step (2), the polymerization reaction is preferably carried out in the coexistence of an acrylate monomer represented by the formula (a'):

(a')

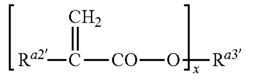

(wherein, $R^{a2'}$ is hydrogen or methyl, $R^{a3'}$ is hydrogen or a $C_{1-50}$ hydrocarbon group where one or more methylene in the hydrocarbon group may be replaced with oxy, amino, imino and/or carbonyl, preferable $R^{a3'}$ is the same as the above-described preferable $R^{a3}$, and x is an integer of 1 to 6, preferably an integer of 3 to 6). The above-described methylene includes a terminal methyl as well.

Further, the acrylate monomer represented by the formula (a') may be a nitrogen and/or oxygen-containing cycloaliphatic hydrocarbon compound that may have a plurality of acrylic acid esters in the molecule and contains an amino group, an imino group, and/or a carbonyl group (preferably a nitrogen-containing aliphatic hydrocarbon ring that contains an imino group and/or a carbonyl group, more preferably 5- or 6-membered ring that contains a nitrogen as a member, and most preferably, a piperidine derivative, a pyrrolidine derivative, or an isocyanurate derivative).

Examples of the acrylate monomer represented by the formula (a') include methoxy polyethylene glycol acrylate, methoxy polyethylene glycol methacrylate, phenoxy polyethylene glycol acrylate, isostearyl acrylate, polyethylene glycol diacrylate, propoxylated bisphenol A diacrylate, tricyclo decandimethanol diacrylate, 1,6-hexanediol diacrylate, dipropylene glycol diacrylate, ethoxylated isocyanuric acid triacrylate, ethoxylated glycerin triacrylate, trimethylolpropane triacrylate, ditrimethylolpropane tetraacrylate, ethoxylated pentaerythritol tetraacrylate, dipentaerythritol hexaacrylate and the like, and preferably methoxypolyethylene glycol acrylate, tricyclodecane dimethanol diacrylate, and ethoxylated isocyanuric acid triacrylate.

Further, in the radical polymerization reaction, the molecular weight can be appropriately controlled using a known chain transfer agent, polymerization inhibitor, molecular weight regulator and the like. Furthermore, the polymerization reaction may be performed in one step or in two or more steps. The temperature of the polymerization reaction is not particularly limited, but is typically in the range of 50° C. to 200° C., and preferably 80° C. to 150° C.

Since the polysiloxane that has been acrylic polymerized in the step (2) has a complicated three-dimensional structure by the acrylic polymerization, it is considered to contribute to improvement of heat resistance and adhesion to a substrate.

The mass average molecular weight of the acrylic polymerized polysiloxane obtained in step (2) is preferably 1.4 to 5 times, more preferably 1.4 to 3 times, the mass average molecular weight of the acrylic group-containing polysiloxane obtained in the step (1).

<Polysiloxane Composition>

The composition according to the present invention comprises the above-described acrylic polymerized polysiloxane and a solvent.

[Solvent]

The solvent is selected from those that uniformly dissolve or disperse each component contained in the composition. Specifically, ethylene glycol monoalkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl ether acetates such as methyl cellosolve acetate and ethyl cellosolve acetate; propylene glycol monoalkyl ethers such as propylene glycol monomethyl ether (PGME) and propylene glycol monoethyl ether; propylene glycol monoalkyl ether acetates such as PGMEA, propylene glycol monoethyl ether acetate and propylene glycol monopropyl ether acetates; aromatic hydrocarbons such as benzene, toluene and xylene; ketones such as methyl ethyl ketone, acetone, methyl amyl ketone, methyl isobutyl ketone and cyclohexanone; alcohols such as isopropanol and propanediol; and the like are included. Preferred are PGMEA and PGME. These solvents are used alone or in combination of two or more of any of these.

The blending ratio of the solvent varies depending on the coating method and the requirement for the film thickness after coating. For example, in the case of spray coating, it is 90 mass % or more based on the total mass of polysiloxane and optional components, but in the case of slit coating of a large glass substrate used in the production of displays, it is usually 50 mass % or more, preferably 60 mass % or more, and usually 90 mass % or less, preferably 85 mass % or less.

The composition according to the invention can contain further additives as required. These additives are described below.

In addition, the composition according to the present invention is either a non-photosensitive composition, or a positive photosensitive composition or a negative photosensitive composition. In the present invention, the positive photosensitive composition means a composition capable of forming a positive image, i.e. when the composition is applied to form a coating film and exposed to light, the solubility of the exposed area in an alkaline developer increases, and the exposed area is removed through development to form a positive image. The negative photosensitive composition means a composition capable of forming a negative image, i.e. when the composition is applied to form a coating film and exposed to light, the exposed area becomes insoluble in an alkaline developer, and the unexposed area is removed through development to form a negative image.

[Diazonaphthoquinone Derivative]

The positive photosensitive composition according to the present invention preferably comprises a diazonaphthoquinone derivative as a photosensitizer. The composition comprising a diazonaphthoquinone derivative can form a positive image that is removed through development because the exposed area becomes soluble in an alkaline developer. This is because, through exposure, solubility in an alkali developer of the exposed area is increased due to the generated indene carboxylic acid, but the solubility of the unexposed area is decreased due to interaction with the silanol groups remaining in polysiloxane.

A preferred diazonaphthoquinone derivative is a compound in which naphthoquinone diazide sulfonic acid is ester-bonded to a compound having phenolic hydroxy. The structure is not particularly limited but is preferably an ester compound with a compound having one or more phenolic hydroxy. As the naphthoquinone diazide sulfonic acid, 4-naphthoquinone diazide sulfonic acid or 5-naphthoquinone diazide sulfonic acid can be used. Since the 4-naphthoquinonediazide sulfonic acid ester compound has absorption in i-line (wavelength: 365 nm) region, it is suitable for i-line exposure. Further, the 5-naphthoquinonediazide sulfonic acid ester compound has absorption in a broad wavelength range and is therefore suitable for exposure in a broad wavelength range. It is preferable to select an appropriate photosensitizer according to wavelength to be exposed and type of silanol condensation catalyst. When (i) a thermal acid generator, (ii) a thermal base generator, or (iii) a photoacid generator, a photobase generator, a photothermal acid generator or a photothermal base generator, any of which has low absorption in said wavelength region of the photosensitizer, is selected as the silanol condensation catalyst, it is preferable to use a 4-naphthoquinone diazide sulfonic acid ester compound or a 5-naphthoquinone diazide sulfonic acid ester compound. A mixture of a 4-naphthoquinone diazide sulfonic acid ester compound and a 5-naphthoquinone diazide sulfonic acid ester compound can also be used.

The compound having phenolic hydroxy is not particularly limited, but examples thereof include bisphenol A, BisP-AF, BisOTBP-A, Bis26B-A, BisP-PR, BisP-LV, BisP-OP, BisP-NO, BisP-DE, BisP-AP, BisOTBP-AP, TrisP-HAP, BisP-DP, TrisP-PA, BisOTBP-Z, BisP-FL, TekP-4HBP, TekP-4HBPA, TrisP-TC (trade name, manufactured by Honshu Chemical Industry Co., Ltd.).

As far as the addition amount of diazonaphthoquinone derivative is concerned, optimum amount thereof varies depending on the esterification ratio of naphthoquinone diazide sulfonic acid, or the physical properties of polysiloxane used, the required photosensitivity, and the dissolution contrast between the exposed area and the unexposed area, but is preferably 1 to 20 parts by mass, more preferably 3 to 15 parts by mass, based on 100 parts by mass of the total amount of polysiloxane. When the addition amount of the diazonaphthoquinone derivative is 1 part by mass or more, the dissolution contrast between the exposed area and the unexposed area is increased, and excellent photosensitive property is obtained. Further, in order to obtain more excellent dissolution contrast, 3 parts by mass or more is preferable. On the other hand, the smaller the addition amount of the diazonaphthoquinone derivative is, the more improved the colorless transparency of the cured film is increased and the higher the transmittance becomes, which is preferable.

[Silanol Condensation Catalyst]

The negative photosensitive composition according to the present invention preferably comprises any one or more silanol condensation catalysts selected from the group consisting of a photoacid generator, a photobase generator, a photothermal acid generator, and a photothermal base generator. Similarly, also in the case of imparting positive photosensitivity, it is preferable to comprise any one or more silanol condensation catalysts, more preferably silanol condensation catalysts selected from a photoacid generator, a photobase generator, a photothermal acid generator, a photothermal base generator, a thermal acid generator, and a thermal base generator. It is preferable that these are selected according to the polymerization reaction and the crosslinking reaction used in the cured film production process.

In the present invention, the photoacid generator does not include the above described diazonaphthoquinone derivative.

As far as these contents are concerned, optimum amounts thereof vary depending on the type of active substance generated by decomposition, the amount generated, and the required photosensitivity/dissolution contrast between the exposed area and the unexposed area, but are preferably 0.1 to 10 parts by mass, and more preferably 0.5 to 5 parts by mass, based on 100 parts by mass of the total mass of polysiloxane. When the addition amount is less than 0.1 parts by mass, the amount of acid or base to be generated is too small, polymerization during post-baking is not accelerated, and pattern reflow is easy to occur. On the other hand, when the addition amount is more than 10 parts by mass, the cured film to be formed may be cracked, or prominently colored due to decomposition thereof, which sometimes invites reduction of the colorless transparency of the cured film. Further, when the addition amount is increased, this may cause deterioration of electrical insulation of the cured film and outgassing due to thermal decomposition, which sometimes become a problem in the subsequent process. Furthermore, the resistance of the cured film to a photoresist stripper containing monoethanolamine or the like as a main agent may be lowered.

In the present invention, the photoacid generator or photobase generator refers to a compound that generates an acid or a base by causing bond cleavage upon exposure to light. The generated acid or base is considered to contribute to the polymerization of the polysiloxane. Here, examples of the light include visible light, ultraviolet ray, infrared ray, X ray, electron beam, a ray, γ ray, and the like.

The photoacid generator or photobase generator to be used for the positive photosensitive composition preferably generates an acid or a base through not an image-wise exposure for projecting a pattern (hereinafter referred to as a first exposure) but the entire surface exposure that is subsequently performed, and preferably has small less absorption at the wavelength of at the time of first exposure. For example, when the first exposure is performed with g-line (peak wavelength: 436 nm) and/or h-line (peak wavelength: 405 nm) and the wavelength at the time of second exposure is changed to g+h+i line (peak wavelength: 365 nm), the photoacid generator or the photobase generator preferably has a greater absorbance at wavelength of 365 nm than that at 436 nm and/or 405 nm.

Specifically, the absorbance at wavelength of 365 nm/absorbance at wavelength of 436 nm or the absorbance at wavelength of 365 nm/absorbance at wavelength of 405 nm is preferably 2 or more, more preferably 5 or more, further preferably 10 or more, and most preferably 100 or more.

Here, the UV-visible absorption spectrum is measured using dichloromethane as a solvent. The measuring device is not particularly limited, but examples thereof include Cary 4000 UV-Vis spectrophotometer (manufactured by Agilent Technologies Japan, Ltd.).

Examples of the photoacid generator, which can be freely selected from generally used ones, include diazomethane compounds, triazine compounds, sulfonic acid esters, diphenyliodonium salts, triphenylsulfonium salts, sulfonium salts, ammonium salts, phosphonium salts, sulfonimide compounds, and the like.

Specific examples of the photoacid generator that can be used, including those described above, are 4-methoxyphenyl diphenyl sulfonium hexafluorophosphonate, 4-methoxyphenyl diphenyl sulfonium hexafluoroarsenate, 4-methoxyphenyl diphenyl sulfonium methane sulfonate, 4-methoxyphenyldiphenylsulfonium trifluoroacetate, triphenylsulfonium tetrafluoroborate, triphenylsulfonium tetrakis(pentafluorophenyl)borate, triphenylsulfonium hexafluorophosphonate, triphenylsulfonium hexafluoroarsenate, 4-methoxyphenyl diphenyl sulfonium-p-toluene sulfonate, 4-phenyl thiophenyl diphenyl tetrafluoroborate, 4-phenyl thiophenyl diphenyl hexafluorophosphonate, triphenyl sulfonium methanesulfonate, triphenylsulfonium trifluoroacetate, triphenylsulfonium-p-toluenesulfonate, 4-methoxyphenyl diphenylsulfonium tetrafluoroborate, 4-phenylthiophenyl diphenyl hexafluoroarsenate, 4-phenylthiophenyl diphenyl-p-toluenesulfonate, N-(trifluoromethylsulfonyloxy)succinimide, N-(trifluoromethylsulfonyloxy)phthalimide, 5-norbornene-2,3-dicarboximidyl triflate, 5-norbornene-2,3-dicarboximidyl-p-toluenesulfonate, 4-phenylthiophenyldiphenyltrifluoromethanesulfonate, 4-phenylthiophenyl diphenyl trifluoroacetate, N-(trifluoromethylsulfonyloxy)diphenylmaleimide, N-(trifluoromethylsulfonyloxy)bicyclo [2.2.1]hept-5-ene-2,3-dicarboximide, N-(trifluoromethylsulfonyloxy)-naphthylimide, N-(nonafluorobutylsulfonyloxy)naphthylimide, and the like.

In addition, when absorption of h-line is not desired, use of 5-propylsulfonyloxyimino-5H-thiophen-2-ylidene-(2-methylphenyl)acetonitrile, 5-octylsulfonyl-oxyimino-5H-thiophene-2-ylidene-(2-methylphenyl)-acetonitrile, 5-camphorsulfonyloxyimino-5H-thiophene-2-ylidene-(2-methylphenyl)acetonitrile, 5-methylphenyl-sulfonyloxyimino-5H-thiophene-2-ylidene-(2-methyl-phenyl)acetonitrile should be avoided, since they have absorption in the wavelength region of h-line.

Examples of the photobase generator include multi-substituted amide compounds having an amide group, lactams, imide compounds or those containing the structure thereof.

Further, an ionic photobase generator including an amide anion, a methide anion, a borate anion, a phosphate anion, a sulfonate anion, a carboxylate anion, and the like as an anion can also be used.

In the present invention, the photothermal acid generator or photothermal base generator refers to a compound that changes its chemical structure but does not generate an acid or base upon exposure to light, and then causes a bond cleavage by heat to generate an acid or base. Among these, photothermal base generator is preferred. As the photothermal base generator, one represented by the following general formula (II), more preferably hydrate or solvate thereof is mentioned. The compound represented by the general formula (II) inverts to cis-form by exposure to light and becomes unstable, so that the decomposition temperature decreases and the base is generated even if the baking temperature is about 100° C. in the subsequent process.

When imparting positive photosensitivity, photothermal base generator does not need to be adjusted with the absorption wavelength of the diazonaphthoquinone derivative.

(II)

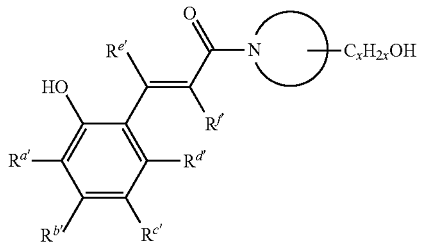

wherein, x is an integer of 1 or more and 6 or less, and $R^{a'}$ to $R^{f'}$ are each independently hydrogen, halogen, hydroxy, mercapto, sulfide, silyl, silanol, nitro, nitroso, sulfino, sulfo, sulfonato, phosphino, phosphinyl, phosphono, phosphonato, amino, ammonium, a $C_{1-20}$ aliphatic hydrocarbon group optionally having a substituent, a $C_{6-22}$ aromatic hydrocarbon group optionally having a substituent, a $C_{1-20}$ alkoxy optionally having a substituent, or a $C_{6-20}$ aryloxy group optionally having a substituent.

Among these, for $R^{a'}$ to $R^{d'}$, particularly hydrogen, hydroxy, a $C_{1-6}$ aliphatic hydrocarbon group, or $C_{1-6}$ alkoxy is preferable, and for $R^{e'}$ and $R^{f'}$, particularly hydrogen is preferable. Two or more of $R^{1'}$ to $R^{4'}$ may be bonded to form a cyclic structure. At this time, the cyclic structure may contain a hetero atom.

N is a constituent atom of a nitrogen-containing heterocyclic ring, the nitrogen-containing heterocyclic ring is a 3- to 10-membered ring, and the nitrogen-containing heterocyclic ring may further have a $C_{1-20}$—, in particular $C_{1-6}$—, aliphatic hydrocarbon group, which may contain one or more substituents that are different from $C_xH_{2x}OH$ shown in the formula (II).

It is preferred that $R^{a'}$ to $R^{d'}$ are appropriately selected according to the exposure wavelength to be used. In display applications, for example, unsaturated hydrocarbon bonding functional groups such as vinyl and alkynyl which shift the absorption wavelength to g-, h- and i-line, alkoxy, nitro and the like are used, and particularly methoxy and ethoxy are preferred.

Specifically, the followings can be included.

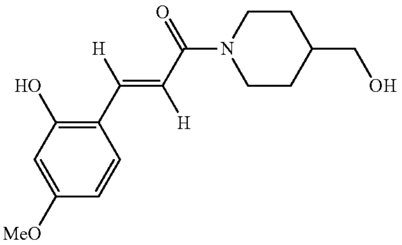

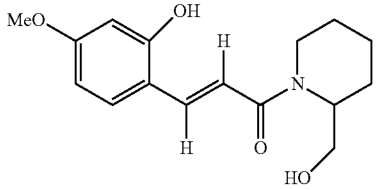

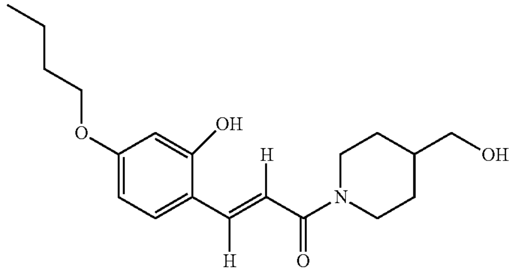

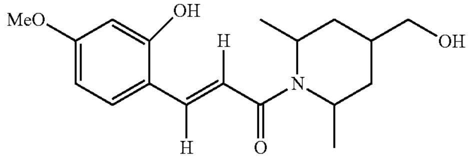

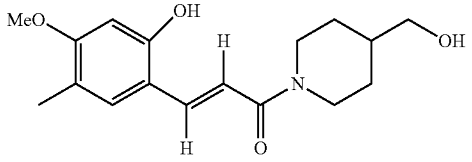

When the composition according to the present invention is a non-photosensitive composition, it preferably comprises a thermal acid generator or a thermal base generator. In the present invention, the thermal acid generator or the thermal base generator refers to a compound that causes bond cleavage by heat to generate an acid or a base. It is preferable that these do not generate any acid or base by heat during pre-baking after application of the composition or generate only a small amount.

The thermal acid generators include salts and esters that generate organic acids, for example, various aliphatic sulfonic acids and salts thereof; various aliphatic carboxylic acids such as citric acid, acetic acid and maleic acid, and salts thereof; various aromatic carboxylic acids such as benzoic acid and phthalic acid, and salts thereof; aromatic sulfonic acids and ammonium salts thereof; various amine salts: aromatic diazonium salts: phosphonic acids and salts thereof; and the like. Among the thermal acid generators, in particular, a salt composed of an organic acid and an organic base is preferred, and a salt composed of sulfonic acid and an organic base is further preferred. Preferred sulfonic acids include p-toluenesulfonic acid, benzenesulfonic acid, p-dodecylbenzenesulfonic acid, 1,4-naphthalenedi-sulfonic acid, methanesulfonic acid, and the like. These acid generators can be used alone or in combination.

Examples of the thermal base generator include a compound that generates a base, such as imidazole, tertiary amine and quaternary ammonium, and mixtures thereof. Examples of the base to be released include imidazole derivatives such as N-(2-nitrobenzyloxycarbonyl) imidazole, N-(3-nitrobenzyloxycarbonyl) imidazole, N-(4-nitrobenzyloxycarbonyl) imidazole, N-(5-methyl-2-nitrobenzyloxycarbonyl) imidazole and N-(4-chloro-2-nitrobenzyloxycarbonyl) imidazole, and 1,8-diazabicyclo [5.4.0]undecene-7. Like the acid generators, these base generators can be used alone or in combination.

As the other additives, surfactants, developer dissolution accelerators, scum removers, adhesion enhancers, polymerization inhibitors, antifoaming agents, and photosensitizing enhancing agents are mentioned.

Since the surfactant can improve coatability, using it is preferable. Examples of the surfactant that can be used in the polysiloxane composition in the present invention include nonionic surfactants, anionic surfactants, amphoteric surfactants, and the like.

Examples of the above-described nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol; acetylene alcohol derivatives, such as polyethoxylate of acetylene alcohol; acetylene glycol derivatives, such as polyethoxylate of acetylene glycol; fluorine-containing surfactants, such as Fluorad (trade name, manufactured by 3M Japan Limited), Megafac (trade name, manufactured by DIC Corporation), Surufuron (trade name, AGC Inc.); or organosiloxane surfactants, such as KP341 (trade name, manufactured by Shin-Etsu Chemical Co., Ltd.). Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexanediol and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid and the like.

Further, examples of the amphoteric surfactant include 2-alkyl-N-carboxymethyl-N-hydroxyethyl imidazolium betaine, lauric acid amide propyl hydroxysulfone betaine and the like.

These surfactants can be used alone or as a mixture of two or more kinds, and the mixing ratio thereof is usually 50 to 10,000 ppm, preferably 100 to 5,000 ppm, to the total mass of the composition.

When the composition of the present invention is photosensitive, developer dissolution accelerator or scum remover adjusts solubility of the formed coating film in the developer and has action to prevent scum from remaining on the substrate after development. As such an additive, crown ether can be used.

The addition amount thereof is preferably 0.05 to 15 parts by mass, more preferably 0.1 to 10 parts by mass, to 100 parts by mass, based on the total mass of polysiloxane.

Further, when the composition of the present invention is photosensitive, a photosensitizing enhancing agent can be added as necessary. As the photosensitizing enhancing agent preferably used in the positive type, coumarins, ketocoumarins and their derivatives, acetophenones, and sensitizing dyes such as pyrylium salts and thiopyrylium salts are mentioned.

Further, anthracene skeleton-containing compounds can be used as the photosensitizing enhancing agent. When a photosensitizing enhancing agent is used, the addition amount is preferably 0.01 to 5 parts by mass to 100 parts by mass of the total mass of polysiloxane.

When the composition of the present invention is photosensitive, a polymerization inhibitor such as nitrone, nitroxide radical, hydroquinone, catechol, phenothiazine, phenoxazine, hindered amine and derivatives thereof, and an ultraviolet absorber can be added. The addition amount is preferably 0.01 to 20 parts by mass to 100 parts by mass of the total mass of polysiloxane.

As the antifoaming agent, alcohols ($C_{1-18}$), higher fatty acids such as oleic acid and stearic acid, higher fatty acid esters such as glycerin monolaurate, polyethers such as polyethylene glycols (PEG) (Mn: 200 to 10,000) and polypropylene glycols (PPG) (Mn: 200 to 10,000), silicone compounds such as dimethyl silicone oil, alkyl-modified silicone oil and fluorosilicone oil, and organosiloxane-based surfactants are mentioned. These can be used alone or in combination of any of these. The addition amount thereof is preferably 0.1 to 3 parts by mass to 100 parts by mass of the total mass of polysiloxane.

The adhesion enhancer has an effect of preventing a pattern from being peeled off by stress applied after curing when a cured film is formed using the composition according to the present invention. As the adhesion enhancer, imidazoles and silane coupling agents are preferable.

These other additives can be used alone or in combination of two or more of any of these, and the addition amount thereof is 20 parts by mass or less, preferably 0.05 to 15 parts by mass, to 100 parts by mass of the total mass of polysiloxane.

<Cured Film and Electronic Device Comprising the Same>

The cured film according to the present invention can be produced by applying the polysiloxane composition according to the present invention on a substrate and heating. When the composition according to the present invention is a photosensitive composition, a pattern formed cured film can be formed.

First, the above-described composition is applied on a substrate. Formation of the coating film of the composition in the present invention can be carried out by any method conventionally known as a method for coating a composition. Specifically, it can be freely selected from dip coating, roll coating, bar coating, brush coating, spray coating, doctor coating, flow coating, spin coating, slit coating and the like.

Further, as the substrate on which the composition is applied, a suitable substrate such as a silicon substrate, a glass substrate, a resin film, or the like can be used. Various semiconductor devices and the like may be formed on these substrates as needed. When the substrate is a film, gravure coating can also be utilized. If desired, a drying process may be additionally provided after coating the film. Further, if necessary, the coating process can be repeated once or twice or more to make the film thickness of the coating film to be formed as desired.

After forming the coating film of the composition according to the present invention, it is preferable to carry out pre-baking (heat treatment) of the coating film in order to dry the coating film and reduce the residual amount of the solvent. The pre-baking process can be carried out at a temperature of generally 70 to 150° C., preferably 90 to 120° C., in the case of a hot plate, for 10 to 180 seconds, preferably 30 to 90 seconds and in the case of a clean oven, for 1 to 30 minutes.

In the case of the non-photosensitive composition, the resulting product is then heated to cure the coating film. The heating temperature in this heating step is not particularly limited as long as it is a temperature at which curing of the coating film can be performed and can be freely determined. However, if the silanol group remains, the chemical resistance of the cured film may be insufficient, or the dielectric constant of the cured film may be increased. From such a viewpoint, a relatively high temperature is generally selected as the heating temperature. In order to accelerate the curing reaction and obtain a sufficient cured film, the curing temperature is preferably 200° C. or higher, and more preferably 350° C. or higher. Further, the heating time is not particularly limited and is generally 10 minutes to 24 hours, and preferably 30 minutes to 3 hours. In addition, this heating time is a time from when the temperature of the pattern film reaches a desired heating temperature. Usually, it takes about several minutes to several hours for the pattern film to reach a desired temperature from the temperature before heating.

In the case of a photosensitive composition, the coating film surface is then irradiated with light. As a light source to be used for the light irradiation, any one conventionally used for a pattern forming method can be used. As such a light source, a high-pressure mercury lamp, a low-pressure mercury lamp, a lamp such as metal halide and xenon, a laser diode, an LED and the like can be included. Ultraviolet ray such as g-line, h-line and i-line is usually used as the irradiation light. Except ultrafine processing for semiconductors or the like, it is general to use light of 360 to 430 nm (high-pressure mercury lamp) for patterning of several μm to several ten μm. Above all, in the case of liquid crystal display devices, light of 430 nm is often used. The energy of the irradiation light is generally 5 to 2,000 $mJ/cm^2$, preferably 10 to 1,000 $mJ/cm^2$, although it depends on the light source and the film thickness of the coating film. If the irradiation light energy is lower than 5 $mJ/cm^2$, sufficient resolution cannot be obtained in some cases. On the other hand, when the irradiation light energy is higher than 2,000 $mJ/cm^2$, the exposure becomes excess and occurrence of halation is sometimes brought.

In order to irradiate light in a pattern shape, a general photomask can be used. Such a photomask can be freely selected from well-known ones. The environment at the time of irradiation is not particularly limited, gut it may generally be set as an ambient atmosphere (in the air) or nitrogen atmosphere. Further, in the case of forming a film on the entire surface of the substrate, light irradiation may be performed over the entire surface of the substrate. In the present invention, the pattern film also includes such a case where a film is formed on the entire surface of the substrate.

After the exposure, to promote the reaction between the polymer in the film by the acid or base generated in the exposed area, particularly in the case of the negative type, post exposure baking can be performed as necessary. Different from the heating process to be described later, this heat treatment is performed not to completely cure the coating film but to leave only a desired pattern on the substrate after development and to make other areas capable of being removed by development. When post exposure baking is performed after exposure, a hot plate, an oven, a furnace, and the like can be used. The heating temperature should not be excessively high because it is not desirable for the acid or base in the exposed area generated by light irradiation to diffuse to the unexposed area. From such a viewpoint, the range of the heating temperature after exposure is preferably 40° C. to 150° C., and more preferably 60° C. to 120° C. Stepwise heating can be applied as needed to control the curing rate of the composition. Further, the atmosphere during the heating is not particularly limited, but can be selected from in an inert gas such as nitrogen, under a vacuum, under a reduced pressure, in an oxygen gas and the like, for the purpose of controlling the curing rate of the composition. Further, the heating time is preferably above a certain level in order to maintain higher the uniformity of temperature history in the wafer surface and is preferably not excessively long in order to suppress diffusion of the generated acid or base. From such a viewpoint, the heating time is preferably 20 seconds to 500 seconds, and more preferably 40 seconds to 300 seconds. When a positive photosensitive composition is used, not to generate the acid or base of the photoacid generator, photobase generator, thermal acid generator or thermal base generator at this stage and not to promote the crosslinking between the polymer, it is preferable not to perform the post exposure baking.

After that, the coating film is developed. As the developer to be used at the time of development, any developer conventionally used for developing a photosensitive composition can be used. Preferable examples of the developer include an alkali developer which is an aqueous solution of an alkaline compound such as tetraalkylammonium hydroxide, choline, alkali metal hydroxide, alkali metal metasilicate (hydrate), alkali metal phosphate (hydrate), aqueous ammonia, alkylamine, alkanolamine and heterocyclic amine, and a particularly preferable alkali developer is a TMAH aqueous solution. In this alkali developer, a water-soluble organic solvent such as methanol and ethanol, or a surfactant may be further contained, if necessary. The developing method can also be freely selected from conventionally known methods. Specifically, methods such as dipping in a developer (dip), paddle, shower, slit, cap coat, spray and the like can be included. After development with a developer, by which a pattern can be obtained, it is preferable that rinsing with water is carried out.

After that, an entire surface exposure (flood exposure) process is usually performed. When a photoacid generator or a photobase generator is used, an acid or a base is generated in this entire surface exposure process. When a photothermal acid generator or a photothermal base generator is used, chemical structure changes in this entire surface exposure process. Further, when there is an unreacted diazonaphthoquinone derivative remaining in the film, it is photodegraded and the optical transparency of the film is further increased; therefore, it is preferable to perform the entire surface exposure process when transparency is required. When a thermal acid generator or a thermal base generator is selected, the entire surface exposure is not essential, but it is preferable to perform the entire surface exposure for the above purpose. As the method of entire surface exposure, there is a method for exposing light over the entire surface with about 100 to 2,000 mJ/cm$^2$ (in terms of exposure amount at wavelength of 365 nm) using an ultraviolet visible exposure machine such as an aligner (for example, PLA-501F, manufactured by Canon Inc.).

Curing of the coating film is performed by heating the obtained pattern film. The heating conditions are the same as the case in which the above-described non-photosensitive composition is used.

When heated at 350° C. for 60 minutes, adhesion strength to the alkali free glass substrate of the cured film measured by the stud pull test is preferably 35 Mpa or more, and more preferably 40 Mpa or more. Specifically, the stud pull test is carried out by cutting the cured film together with the substrate into small pieces, joining a plastic stud with the cured film via an epoxy resin layer, pulling the stud, and measuring the load at the time of peeling using a thin film adhesion strength measuring machine.

Further, the cured film according to the present invention has high transmittance. Specifically, when the final thickness of the cured film is 2 μm, the transmittance to the light having wavelength of 400 nm after heat curing at 350° C. for 30 to 60 minutes is preferably 90% or more. Further, the transmittance to the light having wavelength of 400 nm after heat curing at 230° C. for 30 to 60 minutes is preferably 99% or more.

The cured film thus formed can be suitably utilized in many fields, not only as a planarization film, an interlayer insulating film, a transparent protective film and the like for various devices such as a flat panel display (FPD), but also as an interlayer insulating film for low temperature polysilicon or a buffer coat film for IC chip and the like. Further, the cured film can be also used as an optical device material or the like.

The formed cured film is thereafter subjected to further after-treatment of the substrate such as processing or circuit formation, if necessary, and an electronic device is formed. Any of conventionally known methods can be applied to the after-treatment.

The present invention is explained more specifically below by use of Examples and Comparative Examples, but the present invention is not limited by these Examples and Comparative Examples at all.

Comparative Synthesis Example 1: Synthesis of Polysiloxane a

Into a 2 L flask equipped with a stirrer, a thermometer, and a condenser tube, 49.0 g of 25 mass % TMAH aqueous solution, 600 ml of isopropyl alcohol (IPA) and 4.0 g of water were charged, and then a mixed solution of 68.0 g of methyltrimethoxysilane, 79.2 g of phenyltrimethoxysilane, and 15.2 g of tetramethoxysilane was prepared in a dropping funnel. The mixed solution was added dropwise at 40° C., and the resulting product was stirred at the same temperature for 2 hours and then neutralized by adding a 10% HCl aqueous solution. To the neutralized solution, 400 ml of toluene and 600 ml of water were added to separate the resulting product into two layers, and the aqueous layer was removed. Furthermore, the resulting product was washed three times with 300 ml of water, the obtained organic layer was concentrated under reduced pressure to remove the solvent, and PGMEA was added to the concentrate so as to have a solid content concentration of 35 mass %, thereby obtaining Polysiloxane a solution.

When the molecular weight (in terms of polystyrene) of the obtained Polysiloxane a was measured by GPC (gel permeation chromatography), the mass average molecular weight (hereinafter sometimes abbreviated as "Mw") was 1,800. Further, the obtained resin solution was applied on a silicon wafer by a spin coater (MS-A100, manufactured by Mikasa Co., Ltd.) to make the film thickness after pre-baking become 2 μm, and the dissolution rate to 2.38% TMAH aqueous solution (hereinafter sometimes abbreviated as "ADR") was measured after pre-baking, which was 1,200 Å/sec.

Comparative Synthesis Example 2: Synthesis of Polysiloxane b

Into a 2 L flask equipped with a stirrer, a thermometer, and a condenser tube, 30.6 g of 25 mass % TMAH aqueous solution, 600 ml of IPA and 2.5 g of water were charged, and then a mixed solution of 6.8 g of methyltrimethoxysilane, 29.7 g of phenyltrimethoxysilane, 7.6 g of tetramethoxysilane and 62.1 g of 3-(methacryloyloxy)propyltrimethoxysilane was prepared in a dropping funnel. The mixed solution was added dropwise at 40° C., and the resulting product was stirred at the same temperature for 2 hours and then neutralized by adding a 10% HCl aqueous solution. To the neutralized solution, 400 ml of toluene and 600 ml of water were added to separate the resulting product into two layers, and the aqueous layer was removed. Furthermore, the resulting product was washed three times with 300 ml of water, the obtained organic layer was concentrated under reduced pressure to remove the solvent, and PGMEA was added to the concentrate so as to have a solid content concentration of 30 mass %, thereby obtaining Polysiloxane b solution.

The obtained Polysiloxane b had Mw=3,323 and ADR=775 Å/sec.

Synthesis Example 1: Synthesis of Acrylic Polymerized Polysiloxane A

Into a 100 mL flask equipped with a stirrer, a thermometer, and a condenser, 20.4 g of the above Polysiloxane b solution and 0.205 g of azabisisobutyronitrile were charged and stirring was performed at 80° C. for 4 hours, thereby obtaining Acrylic Polymerized Polysiloxane A solution.

The obtained Acrylic Polymerized Polysiloxane A had Mw=7,112 and ADR=658 Å/sec.

Synthesis Example 2: Synthesis of Acrylic Polymerized Polysiloxane B

Into a 2 L flask equipped with a stirrer, a thermometer, and a condenser tube, 36.7 g of 25 mass % TMAH aqueous solution, 600 ml of IPA and 3.0 g of water were charged, and then a mixed solution of 17 g of methyltrimethoxysilane, 29.7 g of phenyltrimethoxysilane, 7.6 g of tetramethoxysilane and 43.4 g of 3-(methacryloyloxy)propyltrimethoxysilane was prepared in a dropping funnel. The mixed solution was added dropwise at 40° C., and the resulting product was stirred at the same temperature for 2 hours and then neutralized by adding a 10% HCl aqueous solution. To the neutralized solution, 400 ml of toluene and 600 ml of water were added to separate the resulting product into two layers, and the aqueous layer was removed. Furthermore, the resulting product was washed three times with 300 ml of water, the obtained organic layer was concentrated under reduced pressure to remove the solvent, and PGMEA was added to the concentrate so as to have a solid content concentration of 30 mass %, thereby obtaining a polysiloxane solution. The polysiloxane obtained at this stage had Mw=3,722.

Into a 100 mL flask equipped with a stirrer, a thermometer, and a condenser tube, 20.4 g of the polysiloxane solution and 0.144 g of azabisisobutyronitrile were charged and the resulting product was stirred at 80° C. for 4 hours, thereby obtaining Acrylic Polymerized Polysiloxane B solution.

The obtained Acrylic Polymerized Polysiloxane B had Mw=5,966.

Synthesis Example 3: Synthesis of Acrylic Polymerized Polysiloxane C

Into a 2 L flask equipped with a stirrer, a thermometer, and a condenser tube, 42.8 g of 25 mass % TMAH aqueous solution, 600 ml of IPA and 3.5 g of water were charged, and then a mixed solution of 27.2 g of methyltrimethoxysilane, 29.7 g of phenyltrimethoxysilane, 7.6 g of tetramethoxysilane and 24.8 g of 3-(methacryloyloxy)propyltrimethoxysilane was prepared in a dropping funnel. The mixed solution was added dropwise at 40° C., and the resulting product was stirred at the same temperature for 2 hours and then neutralized by adding a 10% HCl aqueous solution. To the neutralized solution, 400 ml of toluene and 600 ml of water were added to separate the resulting product into two layers, and the aqueous layer was removed. Furthermore, the resulting product was washed three times with 300 ml of water, the obtained organic layer was concentrated under reduced pressure to remove the solvent, and PGMEA was added to the concentrate so as to have a solid content concentration of 30 mass %, thereby obtaining a polysiloxane solution. The polysiloxane obtained at this stage had Mw=1,592 and ADR=14,500 Å/sec.

Into a 100 mL flask equipped with a stirrer, a thermometer, and a condenser tube, 20.4 g of the polysiloxane solution and 0.082 g of azabisisobutyronitrile were charged and the resulting product was stirred at 80° C. for 4 hours, thereby obtaining Acrylic Polymerized Polysiloxane C solution.

The obtained Acrylic Polymerized Polysiloxane C had Mw=2,365.

Synthesis Example 4: Synthesis of Acrylic Polymerized Polysiloxane D

Into a 2 L flask equipped with a stirrer, a thermometer, and a condenser tube, 80.0 g of 25 mass % TMAH aqueous solution, 600 ml of IPA and 4.0 g of water were charged, and then a mixed solution of 17.0 g of methyltrimethoxysilane, 29.7 g of phenyltrimethoxysilane, 30.8 g of tris-(3-trimethoxy-silylpropyl)isocyanurate, and 43.4 g of 3-(methacryloyloxy)propyltrimethoxysilane was prepared in a dropping funnel. The mixed solution was added dropwise at 40° C., and the resulting product was stirred at the same temperature for 2 hours and then neutralized by adding a 10% HCl aqueous solution. To the neutralized solution, 400 ml of toluene and 600 ml of water were added to separate the resulting product into two layers, and the aqueous layer was removed. Furthermore, the resulting product was washed three times with 300 ml of water, the obtained organic layer was concentrated under reduced pressure to remove the solvent, and PGMEA was added to the concentrate so as to have a solid content concentration of 30 mass %, thereby obtaining a polysiloxane solution. The polysiloxane obtained at this stage had Mw=8,693.

Into a 100 mL flask equipped with a stirrer, a thermometer, and a condenser tube, 20.4 g of the polysiloxane solution and 0.144 g of azabisisobutyronitrile were charged and the resulting product was stirred at 80° C. for 4 hours, thereby obtaining Acrylic Polymerized Polysiloxane D solution.

The obtained Acrylic Polymerized Polysiloxane D had Mw=14,171.

Synthesis Example 5: Synthesis of Acrylic Polymerized Polysiloxane E

In the same manner as in Synthesis Example 2, a polysiloxane solution was obtained.

Into a 100 mL flask equipped with a stirrer, a thermometer, and a condenser tube, 20.4 g of the polysiloxane solution, 0.410 g of azabisisobutyronitrile, and 0.85 g of tricyclodecane dimethanol diacrylate were charged, and the resulting product was stirred at 80° C. for 4 hours, thereby obtaining Acrylic Polymerized Polysiloxane E solution.

The obtained Acrylic Polymerized Polysiloxane E had Mw=6,236.

Synthesis Example 6: Synthesis of Acrylic Polymerized Polysiloxane F

In the same manner as in Synthesis Example 4, a polysiloxane solution was obtained.

Into a 100 mL flask equipped with a stirrer, a thermometer, and a condenser tube, 20.4 g of the polysiloxane solution, 0.410 g of azabisisobutyronitrile, and 2.36 g of tris-(2-acryloxyethyl)isocyanurate were charged, and the resulting product was stirred at 80° C. for 4 hours, thereby obtaining Acrylic Polymerized Polysiloxane F solution.

The obtained Acrylic Polymerized Polysiloxane F had Mw=6,428.

Synthesis Example 7: Synthesis of Acrylic Polymerized Polysiloxane G

Into a 2 L flask equipped with a stirrer, a thermometer, and a condenser tube, 39.7 g of 25 mass % TMAH aqueous solution, 600 ml of IPA and 3.3 g of water were charged, and then 124 g of 3-(methacryloyloxy)propyltrimethoxysilane was taken to a dropping funnel. The silane compound was added dropwise at 40° C., and the resulting product was stirred at the same temperature for 2 hours and then neutralized by adding a 10% HCl aqueous solution. To the neutralized solution, 400 ml of toluene and 600 ml of water were added to separate the resulting product into two layers, and the aqueous layer was removed. Furthermore, the resulting product was washed three times with 300 ml of water, the obtained organic layer was concentrated under reduced pressure to remove the solvent, and PGMEA was added to the concentrate so as to have a solid content concentration of 30 mass %, thereby obtaining a polysiloxane solution. The polysiloxane obtained at this stage had Mw=1,622.

Into a 100 mL flask equipped with a stirrer, a thermometer, and a condenser tube, 20.4 g of the polysiloxane solution and 0.288 g of azabisisobutyronitrile were charged and the resulting product was stirred at 80° C. for 4 hours, thereby obtaining Acrylic Polymerized Polysiloxane G solution.

The obtained Acrylic Polymerized Polysiloxane G had Mw=5,756.

Synthesis Example 8: Synthesis of Acrylic Polymerized Polysiloxane H

Into a 2 L flask equipped with a stirrer, a thermometer, and a condenser tube, 36.7 g of 25 mass % TMAH aqueous solution, 600 ml of IPA and 3.0 g of water were charged, and then a mixed solution of 17 g of methyltrimethoxysilane, 29.7 g of phenyltrimethoxysilane, 7.6 g of tetramethoxysilane and 43.4 g of 3-(methacryloyloxy)propyltrimethoxysilane was prepared in a dropping funnel. The mixed solution was added dropwise at 40° C., and the resulting product was stirred at the same temperature for 2 hours and then neutralized by adding a 10% HCl aqueous solution. To the neutralized solution, 400 ml of toluene and 600 ml of water were added to separate the resulting product into two layers, and the aqueous layer was removed. Furthermore, the resulting product was washed three times with 300 ml of water, the obtained organic layer was concentrated under reduced pressure to remove the solvent, and PGMEA was added to the concentrate so as to have a solid content concentration of 30 mass %, thereby obtaining a polysiloxane solution. The polysiloxane obtained at this stage had Mw=3,722.

Into a 100 mL flask equipped with a stirrer, a thermometer, and a condenser tube, 14.7 g of the polysiloxane solution, 0.35 g of methacrylic acid, and 0.63 g of azabisisobutyronitrile were charged and the resulting product was stirred at 80° C. for 4 hours, thereby obtaining Acrylic Polymerized Polysiloxane H solution.

The obtained Acrylic Polymerized Polysiloxane H had Mw=5,966.

Synthesis Example 9: Synthesis of Acrylic Polymerized Polysiloxane I

Into a 2 L flask equipped with a stirrer, a thermometer, and a condenser tube, 36.7 g of 25 mass % TMAH aqueous solution, 600 ml of IPA and 3.0 g of water were charged, and then a mixed solution of 17 g of methyltrimethoxysilane, 29.7 g of phenyltrimethoxysilane, 7.6 g of tetramethoxysilane and 43.4 g of 3-(methacryloyloxy)propyltrimethoxysilane was prepared in a dropping funnel. The mixed solution was added dropwise at 40° C., and the resulting product was stirred at the same temperature for 2 hours and then neutralized by adding a 10% HCl aqueous solution. To the neutralized solution, 400 ml of toluene and 600 ml of water were added to separate the resulting product into two layers, and the aqueous layer was removed. Furthermore, the resulting product was washed three times with 300 ml of water, the obtained organic layer was concentrated under reduced pressure to remove the solvent, and PGMEA was added to the concentrate so as to have a solid content concentration of 30 mass %, thereby obtaining a polysiloxane solution. The polysiloxane obtained at this stage had Mw=3,722.

Into a 100 mL flask equipped with a stirrer, a thermometer, and a condenser tube, 14.7 g of the polysiloxane solution, 0.35 g of methacrylic acid, 0.4 g of methyl methacrylate, and 0.63 g of azabisisobutyronitrile were charged and the resulting product was stirred at 80° C. for 4 hours, thereby obtaining Acrylic Polymerized Polysiloxane I solution.

The obtained Acrylic Polymerized Polysiloxane I had Mw=7,890.

<Preparation of non-photosensitive, Compositions 101 to 107 and Comparative Compositions 101 and 102>

PGMEA was added to Acrylic Polymerized Polysiloxane A solution so as to have a solid content concentration of 30 mass %, thereby obtaining Composition 101.

Similarly, PGMEA was added to Acrylic Polymerized Polysiloxane B to G solutions so as to have a solid content concentration of 30 mass %, thereby obtaining Compositions 102 to 107, respectively.

Similarly, PGMEA was added to Polysiloxane a and b solutions so as to have a solid content concentration of 25 mass %, thereby obtaining Comparative Compositions 101 and 102, respectively.

To these compositions (the same applies to the following compositions), as necessary, 0.1 parts by mass of a surfactant (KF-53, manufactured by Shin-Etsu Chemical Co., Ltd.) was added. Furthermore, as necessary, a thermal acid generator (SI-100, manufactured by Sanshin Chemical Industry Co., Ltd., 500 ppm) or a thermal base generator (1,8-diazabicyclo(5.4.0)-undecane-7-ortho-phthalate, 500 ppm) was added as a curing agent.

<Preparation of Non-Photosensitive, Compositions 108 and 109>

PGMEA was added to Acrylic Polymerized Polysiloxane H and I solution so as to have a solid content concentration of 30 mass %, thereby obtaining Composition 108 and 109, respectively.

<Preparation of Composition 201 and Comparative Composition 201, Having Positive Photosensitivity>

To 100 parts by mass of Acrylic Polymerized Polysiloxane A solution, 8 parts by mass of 4,4'-(1-(4-(1-(4-hydroxyphenyl)-1-methylethyl)phenyl)-ethylidene)bisphenol modified by diazonaphthoquinone 2.0 mol as a photosensitizer and 1 part by mass of 1,8-naphthalimidyl triflate (trade name "NAI-105", manufactured by Midori Kagaku Co., Ltd. (this has no absorption peak at the wavelength of 400 to 800 nm)) as a photoacid generator were added, the resulting product was stirred, and PGMEA was added so as to have a solid content concentration of 25 mass %, thereby preparing Composition 201 having positive photosensitivity.

Comparative Composition 201 having positive photosensitivity was prepared in the same manner as Composition 201 except that Polysiloxane a solution was used instead of Acrylic Polymerized Polysiloxane A solution.

Composition 201 and Comparative Composition 201, prepared above, were each applied on a 4-inch silicon wafer by spin coating so that the final film thickness was 2 μm. The obtained coating film was pre-baked at 100° C. for 90 seconds to evaporate the solvent. The coating film after dried was subjected to pattern exposure with 100 to 200 $mJ/cm^2$ using g+h+i line mask aligner (product name: PLA-501F type, manufactured by Canon Inc.). Thereafter, paddle development was performed for 90 seconds using a 2.38% TMAH aqueous solution, followed by rinsing with pure water for 60 seconds. Whichever composition was used, it was confirmed that there was no residue in the exposed area of a contact hole of 5 μm and 1:1, and that a good pattern was obtained.

<Preparation of Composition 301 and Comparative Composition 301, Having Negative Photosensitivity>

To 100 parts by mass of Acrylic Polymerized Polysiloxane A solution, 2 parts by mass of 1,8-naphthalimidyl triflate as a photoacid generator was added, the resulting product was stirred, and PGMEA was added so as to have a solid content concentration of 25 mass %, thereby preparing Composition 301 having negative photosensitivity.

Comparative Composition 301 having negative photosensitivity was prepared in the same manner as Composition 301 except that Polysiloxane a solution was used instead of Acrylic Polymerized Polysiloxane A solution.

Composition 301 and Comparative Composition 301, prepared above, were each applied on a 4-inch silicon wafer by spin coating so that the final film thickness was 2 μm. The obtained coating film was pre-baked at 100° C. for 90 seconds to evaporate the solvent. The coating film after dried was subjected to pattern exposure with 100 to 200 $mJ/cm^2$ using g+h+i line mask aligner. After the exposure, the film was heated at 100° C. for 60 seconds, then subjected to paddle development for 60 seconds using a 2.38% TMAH aqueous solution, followed by rinsing with pure water for 60 seconds. It was confirmed that there was no residue in the unexposed area of a contact hole of 5 μm and 1:1, and that a good pattern was obtained.

<Adhesion Evaluation (Stud Pull Test)>

Compositions 101 to 301 and Comparative Compositions 101 to 301 were applied on a 7 cm×7 cm non-alkali glass substrate by spin coating, and the obtained coating film was pre-baked at 100° C. for 90 seconds.

As to Composition 201 and Comparative Composition 201, which have positive photosensitivity, they were pre-baked and then allowed to stand for 90 seconds using a 2.38% TMAH aqueous solution, and further rinsed with pure water for 60 seconds.

As to Composition 301 and Comparative Composition 301, which have negative photosensitivity, they were pre-baked, then subjected to exposure with 100 $mJ/cm^2$ using g+h+i line mask aligner, heated at 100° C. for 60 seconds, then allowed to stand for 60 seconds using a 2.38% TMAH aqueous solution, and further rinsed with pure water for 60 seconds.

Thereafter, Compositions 201 and 301 as well as Comparative Compositions 201 and 301 were subjected to flood exposure with 1,000 $mJ/cm^2$ using g+h+i line mask aligner.

Then, the coating films obtained from Compositions 101 to 301 and Comparative Compositions 101 to 301 were cured by heating at 230° C. for 30 minutes and further at 350° C. for 60 minutes to form cured films. The obtained cured film together with the substrate was cut into small pieces, and the plastic stud and the cured film were joined via an epoxy resin layer. Next, the stud was pulled, and the load at the time of peeling was measured using a thin film adhesion strength measuring machine (Romulus, manufactured by Quad Group). The obtained results were as shown in Table 1.

TABLE 1

| | Adhesion evaluation | |
|---|---|---|
| | 230° C./30 min [MPa] | 350° C./60 min [MPa] |
| Composition 101 | 39 | 59 |
| Composition 102 | 41 | 48 |
| Composition 103 | 37 | 44 |
| Composition 104 | 42 | 51 |
| Composition 105 | 61 | 64 |
| Composition 106 | 61 | 79 (off-scale high) |
| Composition 107 | 62 | 71 (off-scale high) |
| Composition 108 | 60 | 68 |
| Composition 109 | 60 | 66 |
| Composition 201 | 49 | 53 |
| Composition 301 | 40 | 56 |
| Comparative composition 101 | 9.9 | 6.5 |
| Comparative composition 102 | 6.7 | 20 |
| Comparative composition 201 | 25 | 30 |
| Comparative composition 301 | 11 | 8 |

[Transmittance]

When the transmittance of the obtained cured film was measured at 400 nm using MultiSpec-1500 manufactured by Shimadzu Corporation, in each case of heating at 230° C. for 30 minutes, it was 99% or more, and in each case of heating at 350° C. for 60 minutes, it was 90% or more.

The invention claimed is:

1. A polysiloxane composition comprising an acrylic polymerized polysiloxane comprising a repeating unit represented by the formula (Ia), a solvent, and a silanol condensation catalyst;

(Ia)

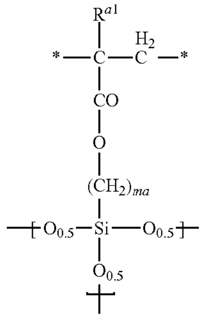

wherein, $R^{a1}$ is hydrogen or methyl, and ma is each independently an integer of 1 to 6;

further comprising:

a repeating unit represented by the following formula (Ic):

(Ic)

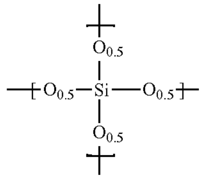

and/or a repeating unit represented by the following formula (Id):

(Id)

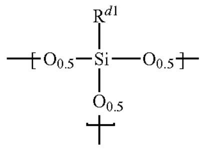

wherein, $R^{d1}$ is a nitrogen and/or oxygen-containing cyclic aliphatic hydrocarbon group that contains an amino group, an imino group and/or a carbonyl group; and further comprising a diazonaphthoquinone derivative;

further comprising an acrylic polymerization unit represented by formula (a):

(a)

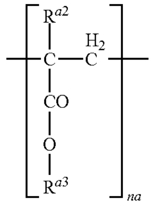

wherein, $R^{a2}$ is independently hydrogen or methyl, $R^{a3}$ is hydrogen or a mono- to hexa-valent $C_{1-50}$ hydrocarbon group, where one or more methylene in the hydrocarbon group may be replaced with oxygen atom, nitrogen atom, imino and/or carbonyl, and when $R^{a3}$ is multivalent, $R^{a3}$ connects carbonyloxy in the formula (a) and carbonyloxy contained in other repeating unit represented by the formula (a), wherein the site marked with * in at least one repeating unit in the formula (Ia) is connected directly or via an acrylic polymerization unit represented by the formula (a) to the site marked with * in other repeating unit represented by the formula (Ia).

2. The polysiloxane composition according to claim 1, wherein the number ratio of the repeating unit represented by the formula (Ia) is 10 to 100 mol % to the total number of siloxane repeating units in the acrylic polymerized polysiloxane.

3. The polysiloxane composition according to claim 1, further comprising a repeating unit represented by the formula (Ib):

(Ib)

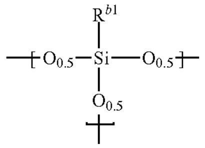

wherein, $R^{b1}$ represents hydrogen, a linear, branched or cyclic, saturated or unsaturated $C_{1-30-}$ aliphatic hydrocarbon group, or an aromatic hydrocarbon group, where the aliphatic hydrocarbon group and aromatic hydrocarbon group are each unsubstituted or substituted with fluorine, hydroxy or alkoxy, and in the aliphatic hydrocarbon group and aromatic hydrocarbon group, methylene is not replaced, or one or more methylene are replaced with oxygen atom, nitrogen atom, imino or carbonyl, provided that $R^{b1}$ is not hydroxy or alkoxy.

4. The polysiloxane composition according to claim 1, further comprising a repeating unit represented by the following formula (Ie):

(Ie)

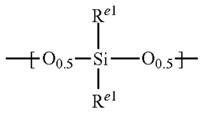

wherein, $R^{e1}$ each independently represents hydrogen, a linear, branched or cyclic, saturated or unsaturated, $C_{1-30}$ aliphatic hydrocarbon group, or an aromatic hydrocarbon group, said aliphatic hydrocarbon group and aromatic hydrocarbon group are each unsubstituted or substituted with fluorine, hydroxy or alkoxy, and in the aliphatic hydrocarbon group, methylene is not replaced, or one or more methylene are replaced with oxygen atom, nitrogen atom, imino or carbonyl, provided that $R^{e1}$ is not hydroxy or alkoxy.

5. A method for producing a cured film, comprising applying the composition according to claim 1 on a substrate and heating.

6. A cured film produced by the method according to claim 5.

7. An electronic device comprising the cured film according to claim 6.

* * * * *